US012743036B2

(12) United States Patent
Xie et al.

(10) Patent No.: US 12,743,036 B2
(45) Date of Patent: Sep. 22, 2026

(54) ALIGNMENT METHOD BASED ON HOLOGRAPHIC LITHOGRAPHY, SYSTEM AND DEVICE

(71) Applicant: HYPER-OPTICS (BEIJING) TECHNOLOGIES LTD., Beijing (CN)

(72) Inventors: Wen Xie, Beijing (CN); Zhiyuan Niu, Beijing (CN); Min Cong, Beijing (CN); Zhi Cheng, Beijing (CN); Hongpeng Qin, Beijing (CN); Kaicheng Wang, Beijing (CN)

(73) Assignee: HYPER-OPTICS (BEIJING) TECHNOLOGIES LTD., Beijing (CN)

( * ) Notice: Subject to any disclaimer, the term of this patent is extended or adjusted under 35 U.S.C. 154(b) by 136 days.

(21) Appl. No.: 18/725,049

(22) PCT Filed: Dec. 6, 2023

(86) PCT No.: PCT/CN2023/136759
§ 371 (c)(1),
(2) Date: Jul. 2, 2024

(87) PCT Pub. No.: WO2024/120435
PCT Pub. Date: Jun. 13, 2024

(65) Prior Publication Data

US 2025/0155829 A1 May 15, 2025

(30) Foreign Application Priority Data

Dec. 8, 2022 (CN) ......................... 202211579191.2

(51) Int. Cl.

| | |
|---|---|
| ***G03F 7/20*** | (2006.01) |
| ***G03F 7/00*** | (2006.01) |
| ***G03F 9/00*** | (2006.01) |

(52) U.S. Cl.
CPC ........ *G03F 9/7076* (2013.01); *G03F 7/70408* (2013.01); *G03F 9/7003* (2013.01); *G03F 9/7049* (2013.01); *G03F 9/7092* (2013.01)

(58) Field of Classification Search
CPC .. G03F 9/7076; G03F 7/70408; G03F 9/7003; G03F 9/7049; G03F 9/7092;
(Continued)

(56) References Cited

U.S. PATENT DOCUMENTS 4,340,305 A 7/1982 Smith et al.
4,596,467 A 6/1986 Bartelt
(Continued)

FOREIGN PATENT DOCUMENTS

CN 2351773 Y 12/1999
CN 1755528 A 4/2006
(Continued)

OTHER PUBLICATIONS

International Search Report and Written Opinion of the International Searching Authority dated Apr. 2, 2024 as received in Application No. PCT/CN2023/136759.
(Continued)

*Primary Examiner* — Mesfin T Asfaw
(74) *Attorney, Agent, or Firm* — Maschoff Brennan

(57) ABSTRACT

An alignment method and related system and device are based on holographic lithography. The method includes controlling an illumination light to generate an alignment image after passing through an alignment image area of a holographic mask. The alignment image includes first and second period images. A period of the first period image is different from that of the second period image. A light intensity corresponding to the first period image and a light intensity corresponding to the second period image are obtained. A relative position of a silicon wafer and/or a
(Continued)

holographic mask is adjusted to determine an alignment position between the silicon wafer and the holographic mask with respect to the holographic lithography based on a condition in which the light intensity corresponding to the first period image and the light intensity corresponding to the second period image are equal and both reach a maximum value.

8 Claims, 6 Drawing Sheets

(58) Field of Classification Search
CPC . G03F 7/20; G03F 9/00; G03F 7/2063; G03F 7/70141; G03F 7/70283; G03F 9/70; G03F 9/7065; G01B 11/00; G02B 5/18; G02B 5/32; G03H 1/00
See application file for complete search history.

(56) References Cited

U.S. PATENT DOCUMENTS 5,182,455 A * 1/1993 Muraki ................. G03F 9/7049 250/548
5,187,372 A 2/1993 Clube
5,414,514 A 5/1995 Smith et al.
2013/0050674 A1* 2/2013 Prosyentsov ......... G03F 9/7088 355/72

FOREIGN PATENT DOCUMENTS

| | | | |
|---|---|---|---|
| CN | 107870385 | A | 4/2006 |
| CN | 101639630 | A | 2/2010 |
| CN | 102096349 | A | 6/2011 |
| CN | 102207695 | A | 10/2011 |
| CN | 114326340 | A | 4/2022 |
| JP | S60-214531 | A | 10/1985 |
| JP | H06244084 | A | 9/1994 |

OTHER PUBLICATIONS

First Office Action dated May 14, 2025 for CN patent application No. 202211579191.2.

* cited by examiner

ALIGNMENT METHOD BASED ON HOLOGRAPHIC LITHOGRAPHY, SYSTEM AND DEVICE

RELATED APPLICATIONS

The present disclosure claims priority to Chinese Patent Application No. 2022115791912, filed on Dec. 8, 2022 and entitled "METHOD AND APPARATUS FOR DETERMINING ALIGNMENT OF LIGHT SOURCE, ELECTRONIC DEVICE AND STORAGE MEDIUM".

TECHNICAL FIELD

The present disclosure relates to the technical field of holographic lithography, in particular to an alignment method based on holographic lithography, a system and a device.

BACKGROUND

Laser holographic lithography is a very promising lithography technology. Its basic principle is to illuminate a specially designed holographic mask through holographic imaging to obtain a desired graphic on a silicon wafer. Extremely high overlay accuracy is often required during an exposure technical process, which places necessary requirements on the alignment between the mask and the wafer. In the existing field of holographic lithography, the alignment between the mask and the wafer needs to be performed by introducing an additional set of alignment system. But the introduction of the additional set of alignment system often implies an additional set of light path and a specialized alignment structure, which directly brings about a rise in cost, an increase in system complexity, and an increase in instability, and also introduces more errors leading to extremely poor overlay accuracy.

Therefore, the prior related art has problems of high cost, high system complexity and lack of stability resulting in the extremely poor overlay accuracy due to the introduction of the additional alignment system.

SUMMARY

In view of this, the present disclosure provides an alignment method based on holographic lithography, a system and a device to at least solve problems of high cost, high system complexity and lack of stability resulting in extremely poor overlay accuracy due to the introduction of an additional alignment system existing in the related art.

A first aspect of the present disclosure provides an alignment method based on holographic lithography, applied to a holographic lithography system. The holographic lithography system includes a holographic mask and a silicon wafer sequentially arranged along a transmission direction of an illumination light. The method includes: controlling the illumination light to generate an alignment image after passing through an alignment image area of the holographic mask, wherein the alignment image includes a first period image and a second period image, and the period of the first period image is different from that of the second period image; obtaining a light intensity corresponding to the first period image and a light intensity corresponding to the second period image generated according to the alignment image; and adjusting a relative position of the silicon wafer and/or the holographic mask to determine an alignment position between the silicon wafer and the holographic mask with respect to the holographic lithography according to a preset alignment condition, wherein the preset alignment condition is that the light intensity corresponding to the first period image and the light intensity corresponding to the second period image are equal and both reach a maximum value.

In some embodiments, the holographic lithography system further includes a grating and a light intensity sensor sequentially arranged between the holographic mask and the silicon wafer along the transmission direction of the illumination light, the grating and the silicon wafer are relatively fixed, and the grating is correspondingly provided with a first alignment area corresponding to the first period image and a second alignment area corresponding to the second period image. The first period image includes a first period fringe and a second period fringe with the same period, the second period image includes a third period fringe and a fourth period fringe with a same period, and a length direction of the first period fringe and a length direction of the third period fringe are the same and perpendicular to a length direction of the second period fringe and a length direction of the fourth period fringe. The first alignment area includes a first alignment grating and a second alignment grating with the same shape as the first period fringe and the second period fringe respectively, and the second alignment area includes a third alignment grating and a fourth alignment grating with the same shape as the third period fringe and the fourth period fringe respectively.

In some embodiments, obtaining the light intensity corresponding to the first period image and the light intensity corresponding to the second period image generated according to the alignment image includes: obtaining a light intensity corresponding to the first alignment grating, a light intensity corresponding to the second alignment grating, a light intensity corresponding to the third alignment grating, and a light intensity corresponding to the fourth alignment grating when the illumination light sequentially passes through the alignment image area and the grating.

In some embodiments, adjusting the relative position of the silicon wafer and/or the holographic mask to determine the alignment position between the silicon wafer and the holographic mask with respect to the holographic lithography according to the preset alignment condition includes: adjusting a relative position of the silicon wafer and/or the holographic mask in a first direction to determine a first position where the light intensity corresponding to the first alignment grating and the light intensity corresponding to the third alignment grating are equal and both reach a maximum value, wherein the first direction is perpendicular to the length direction of the first period fringe; and adjusting a relative position of the silicon wafer and/or the holographic mask in a second direction to determine a second position where the light intensity corresponding to the second alignment grating and the light intensity corresponding to the fourth alignment grating are equal and both reach a maximum value, wherein the second direction is perpendicular to the length direction of the second period fringe.

In some embodiments, the first period fringe, the second period fringe, the third period fringe and the fourth period fringe are all interference fringes, and a light intensity distribution of the interference fringes is:

$$I_0\left(1+\sin\left(2\pi\frac{x}{T}\right)\right)$$

where T is a period, $I_0$ is a reference light intensity, and x is an abscissa of a target point in the interference fringes.

In some embodiments, the first period fringe, the second period fringe, the third period fringe and the fourth period fringe are all period fringes with a light-dark fringe ratio of 1:1, and a light intensity of the bright fringes and the dark fringes does not change.

In some embodiments, the first period fringe and the second period fringe are both period fringes with a light-dark fringe ratio of 1:1, a light intensity in the middle of a bright fringe is weaker than that at two ends, and a light intensity of a dark fringe does not change, and the third period fringe and the fourth period fringe are both period fringes with a light-dark fringe ratio of 1:1, a light intensity in the middle of a bright fringe is stronger than that at two ends, and a light intensity of a dark fringe does not change.

In some embodiments, determining the first position where the light intensity corresponding to the first alignment grating and the light intensity corresponding to the third alignment grating are equal and both reach the maximum value includes: generating a first light intensity-displacement change curve and a second light intensity-displacement change curve according to the light intensity corresponding to the first alignment grating and the light intensity corresponding to the third alignment grating respectively; and obtaining coordinates of a first intersection of the first light intensity-displacement change curve and the second light intensity-displacement change curve at the highest point, wherein the coordinates of the first intersection closest to the origin are coordinates of the first position.

In some embodiments, determining the second position where the light intensity corresponding to the second alignment grating and the light intensity corresponding to the fourth alignment grating are equal and both reach the maximum value includes: generating a third light intensity-displacement change curve and a fourth light intensity-displacement change curve according to the light intensity corresponding to the second alignment grating and the light intensity corresponding to the fourth alignment grating respectively; and obtaining coordinates of a second intersection of the third light intensity-displacement change curve and the fourth light intensity-displacement change curve at the highest point, wherein the coordinates of the second intersection closest to the origin are coordinates of the second position.

A second aspect of the present disclosure provides a holographic lithography system, including a holographic mask, a grating, a light intensity sensor and a silicon wafer sequentially arranged along a transmission direction of an illumination light, the grating is fixed on a workpiece table on which the silicon wafer is placed, the light intensity sensor is connected to a computer device, and the holographic lithography system is configured to implement the alignment method based on holographic lithography according to the first aspect of the present disclosure.

A third aspect of the present disclosure provides a computer device, including: a memory and a processor, the memory and the processor are in a communication connection to each other, computer instructions are stored in the memory, and the processor executes the alignment method based on holographic lithography according to the first aspect of the present disclosure by executing the computer instructions.

A laser system and a control method of the present disclosure at least have following beneficial effects.

According to the alignment method based on holographic lithography, a system and a device of the present disclosure, the illumination light is controlled to generate the alignment image after passing through the alignment image area of the holographic mask, wherein the alignment image includes the first period image and the second period image, and the period of the first period image is different from that of the second period image. The light intensity corresponding to the first period image and the light intensity corresponding to the second period image generated according to the alignment image are obtained. The relative position of the silicon wafer and/or holographic mask is adjusted to determine the alignment position between the silicon wafer and the holographic mask with respect to the holographic lithography according to a preset alignment condition, wherein the preset alignment condition is that the light intensity corresponding to the first period image and the light intensity corresponding to the second period image are equal and both reach a maximum value. Using a characteristic that the holographic mask may generate the alignment image by designing the alignment image area, the alignment between the holographic mask and the silicon wafer may be implemented without constructing an interference light path in a traditional method or introducing the additional alignment system, which simplifies an alignment structure and avoids the introduction of a new amount of error due to the introduction of the alignment system, thus improving the overlay alignment accuracy.

BRIEF DESCRIPTION OF THE DRAWINGS

In order to more clearly illustrate technical solutions in specific embodiments of the present disclosure or the prior art, accompanying drawings that need to be used in the description of the specific embodiments or the prior art will be briefly introduced below. Apparently, the accompanying drawings in the following description show some embodiments of the present disclosure, and for those of ordinary skill in the art, other accompanying drawings may further be obtained according to these accompanying drawings without creative work.

DETAILED DESCRIPTION

Figure 1:
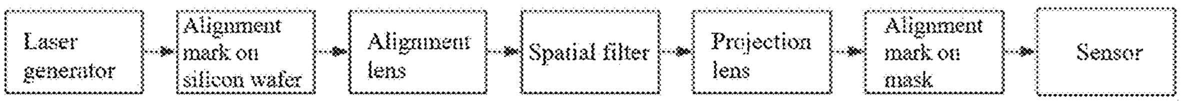
FIG. 1 is a schematic diagram of composition of an existing alignment system.

In order to enable those of skill in the art to better understand solutions of the present application, the following will clearly and completely describe the technical solutions in embodiments of the present application with reference to accompanying drawings in the embodiments of the present application. Apparently, the described embodiments are only part of the embodiments of the present application, rather than all the embodiments. Based on the embodiments in the present application, all other embodiments obtained by those of ordinary skill in the art without making creative work should belong to the protection scope of the present application.

It needs to be noted that terms “first”, “second” and the like in the description and claims of the present application and the above accompanying drawings are used for distinguishing similar objects, and are not necessarily used for describing a specific order or sequence. It should be understood that data so used may be interchanged in appropriate cases so that the embodiments of the present application described here can be implemented in an order other than those illustrated or described here. In addition, terms “include” and “have”, as well as any variations thereof are intended to cover non-exclusive incorporations, e.g., a process, method, system, product, or device that incorporates a series of steps or units is not necessarily limited to those steps or units clearly listed, but may include other steps or units that are not clearly listed or are inherent to this process, method, product, or device.

Lithography is a process of transferring a graphic on a mask onto a silicon wafer, which is a main production procedure in a manufacturing process of an integrated circuit. A fundamental difference between this process and a traditional machining and manufacturing technology is that a structure of the integrated circuit is not shaped by three-dimensional processing, but using a planar technique for stacking on the silicon wafer layer by layer, i.e., an overlay process. This process requires realizing an accurate layer-to-layer alignment, i.e., overlay accuracy.

The degree of integration of the integrated circuit is closely related to the degree of development of a lithography technology, and a more advanced lithography technology creates an integrated circuit of a higher degree of integration. An optical projection exposure technology that images a graphic on a mask onto a wafer through a projection objective is a fastest advancing, most strongly developing and most widely applied lithography technology in the production and manufacturing of integrated circuits at present due to its high accuracy, high productivity and high yield. However, market requirements for feature sizes of integrated circuit are becoming higher and higher, making the requirements for a lithographic resolution more and more strict. How a wavelength of a light source becomes shorter, how a numerical aperture of the objective becomes larger, and how a coating technique and an assembly technology advance are all challenges faced by a traditional optical projection technology. Under this technological demand, a new lithography technology has become a hot spot of research at home and abroad, and various novel lithography technologies based on brand-new methods and techniques have appeared successively, such as extreme ultraviolet lithography, X-ray lithography, ion beam lithography, laser holographic lithography, and nanoimprint lithography.

The laser holographic lithography is a very promising lithography technology. Its basic principle is to illuminate a specially designed holographic mask through holographic imaging to obtain a desired graphic on a silicon wafer. Compared with a traditional projection lithography technology, the laser holographic lithography technology does not require a projection objective system with a complex structure and extremely strict technical requirements. Therefore, this technology has the advantages of low cost and high flexibility. In the existing field of holographic lithography, in order to implement an ultra-high-accuracy overlay technique, an additional set of alignment system is often introduced.

The introduction of the additional set of alignment system often implies an additional set of light path and a specialized alignment light source, which brings about a rise in cost, an increase in system complexity, and an increase in instability, and also introduces more errors leading to extremely poor overlay accuracy. One of the major advantages of the laser holographic lithography technology is to simplify an optical process, avoiding huge difficulties in the processing of an optical apparatus in a projection objective, while the introduction of the additional set of alignment system inevitably puts forward requirements for a processing technique and installation accuracy of the optical apparatus in the alignment system, which is the opposite of its original intention. The additional alignment system will increase energy consumption, improve technical requirements, reduce flexibility, and introduce a new amount of error, which contradicts the advantages envisioned for the laser holographic lithography technology as it should be.

In addition, in a traditional phase alignment system, as shown in FIG. 1, taking a silicon wafer being aligned with a mask as an example, a laser generator is used as an illumination source, which illuminates an alignment mark on the silicon wafer to diffract, then passes through an optical system of the alignment system, a spatial filter, and a lens in a projection objective, and ultimately interferes with imaging at an alignment mark on the mask to form a group of interference fringes. In this way, when an alignment is performed, an intensity of imaging light received at an image sensor will show a changing trend. A final alignment position may be obtained by analyzing the changing trend of interference imaging. That is, the traditional phase alignment system introduces components such as the optical system, the spatial filter, and the lens in the projection objective in order to implement this alignment mode, resulting in an increase in system complexity and an increase in error.

Figure 2:
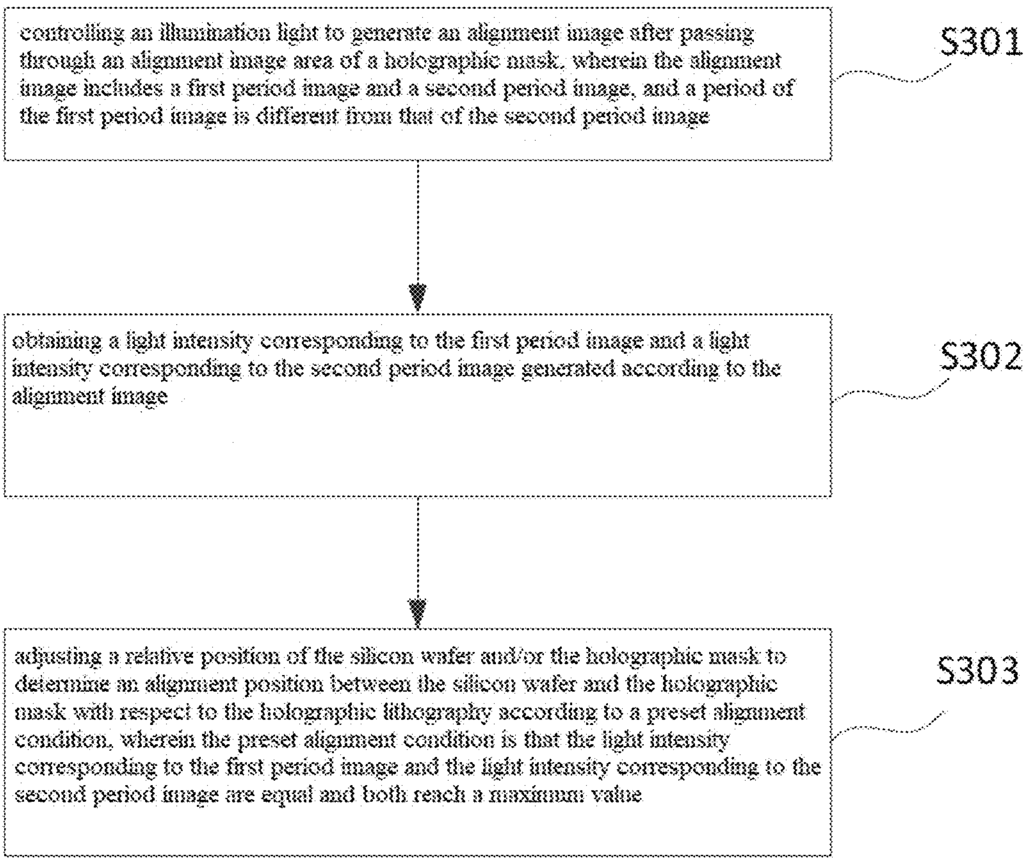
FIG. 2 is a flowchart of an alignment method based on holographic lithography of an embodiment of the present disclosure.

In order to avoid introducing the additional alignment system while ensure ultra-high-accuracy overlay requirements, an embodiment of the present disclosure provides an alignment method based on holographic lithography. The method is applied to a holographic lithography system. The holographic lithography system includes a holographic mask and a silicon wafer sequentially arranged along a transmission direction of an illumination light. As shown in FIG. 2, the method includes:

step S301, the illumination light is controlled to generate an alignment image after passing through an alignment image area of a holographic mask, wherein the alignment image includes a first period image and a second period image, and a period of the first period image is different from that of the second period image;

step S302, a light intensity corresponding to the first period image and a light intensity corresponding to the second period image generated according to the alignment image are obtained; and step S303, a relative position of the silicon wafer and/or holographic mask is adjusted to determine an alignment position between the silicon wafer and the holographic mask with respect to the holographic lithography according to a preset alignment condition, wherein the preset alignment condition is that the light intensity corresponding to the first period image and the light intensity corresponding to the second period image are equal and both reach a maximum value.

Specifically, a mask appearing in the holographic lithography system is the holographic mask. By designing the holographic mask, a desired light intensity may be obtained at an arbitrary position, whereby the alignment image area on the holographic mask may be adjusted and designed so that the alignment image is obtained after the illumination light passes through the alignment image area. The alignment image includes the first period image and the second period image, and the period of the first period image is different from that of the second period image. Exemplarily, the periods of the first period image and the second period image are 16 μm and 17.6 μm respectively.

The first period image and the second period image are generated after the illumination light passes through the alignment image area in the holographic mask. The preset alignment condition is set by detecting the light intensity after action of the first period image passing through a corresponding grating which is fixed relative to the silicon wafer, or other interference element, etc., and the light intensity after action of the second period image passing through the corresponding grating which is fixed relative to the silicon wafer, or other interference element, etc. The preset alignment condition is that the light intensity corresponding to the first period image and the light intensity corresponding to the second period image after passing through the corresponding grating or other interference element are equal and both reach the maximum value. Therefore, whether the holographic mask and the silicon wafer are aligned is judged through the two light intensities. The relative position of the silicon wafer and/or the holographic mask is adjusted, and the silicon wafer and the holographic mask are considered to be aligned when the light intensity corresponding to the first period image and the light intensity corresponding to the second period image are equal and both reach the maximum value.

In the alignment method based on holographic lithography of the embodiment of the present disclosure, the illumination light is controlled to generate the alignment image after passing through the alignment image area of the holographic mask, wherein the alignment image includes the first period image and the second period image, and the period of the first period image is different from that of the second period image. The light intensity corresponding to the first period image and the light intensity corresponding to the second period image generated according to the alignment image are obtained. The relative position of the silicon wafer and/or holographic mask is adjusted to determine the alignment position between the silicon wafer and the holographic mask with respect to the holographic lithography according to a preset alignment condition, wherein the preset alignment condition is that the light intensity corresponding to the first period image and the light intensity corresponding to the second period image are equal and both reach a maximum value. Using a characteristic that the holographic mask may generate the alignment image by designing the alignment image area, the alignment between the holographic mask and the silicon wafer may be implemented without constructing the interference light path in the traditional method or introducing the additional alignment system, which simplifies an alignment structure and avoids the introduction of the new amount of error due to the introduction of the alignment system, thus improving the alignment accuracy.

As an optional embodiment, the holographic lithography system further includes the grating and a light intensity sensor sequentially arranged between the holographic mask and the silicon wafer along the transmission direction of the illumination light, the grating and the silicon wafer are relatively fixed, and the grating is correspondingly provided with a first alignment area corresponding to the first period image and a second alignment area corresponding to the second period image.

The first period image includes a first period fringe and a second period fringe of the same period. The second period image includes a third period fringe and a fourth period fringe of the same period. A length direction of the first period fringe and a length direction of the third period fringe are the same and perpendicular to a length direction of the second period fringe and a length direction of the fourth period fringe. The first alignment area includes a first alignment grating and a second alignment grating with the same shape as the first period fringe and the second period fringe respectively, and the second alignment area includes a third alignment grating and a fourth alignment grating with the same shape as the third period fringe and the fourth period fringe respectively.

Specifically, the grating is mounted on the light intensity sensor, the light intensity sensor is fixed on a surface of a workpiece table on which the silicon wafer is placed, and when the silicon wafer is moved, the grating and the light intensity sensor follow the movement.

Figure 3:
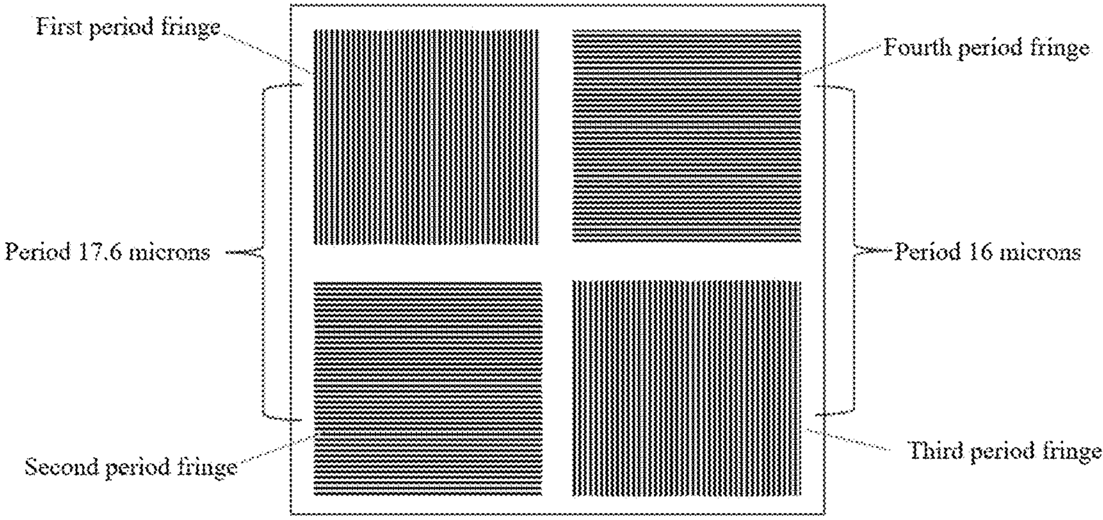
FIG. 3 is a schematic diagram of an alignment image of an embodiment of the present disclosure.

As shown in FIG. 3, the first period image includes the first period fringe and the second period fringe, and the length direction of the first period fringe and the length direction of the second period fringe are perpendicular to each other.

The second period image includes the third period fringe and the fourth period fringe, and the length direction of the third period fringe and the length direction of the fourth period fringe are perpendicular to each other.

The length direction of the first period fringe and the length direction of the third period fringe are the same, and the length direction of the second period fringe and the length direction of the fourth period fringe are the same.

The first alignment area on the grating has the same shape as the first period image, and the second alignment area has the same shape as the second period image. That is, the first alignment area includes the first alignment grating and the second alignment grating with the same shape as the first period fringe and the second period fringe respectively, and the second alignment area includes the third alignment grating and the fourth alignment grating with the same shape as the third period fringe and the fourth period fringe respectively.

By setting two directionally perpendicular period fringes in each period image, it is possible to align the silicon wafer with the holographic mask in two directions, thus realizing an ultra-high-accuracy alignment during an overlay process.

Further, in step S302, obtaining the light intensity corresponding to the first period image and the light intensity corresponding to the second period image generated according to the alignment image includes:

obtaining a light intensity corresponding to the first alignment grating, a light intensity corresponding to the second alignment grating, a light intensity corresponding to the third alignment grating, and a light intensity corresponding to the fourth alignment grating when the illumination light sequentially passes through the alignment image area and the grating.

Specifically, the four period fringes exist in the alignment image, and after passing through the corresponding alignment gratings respectively, the light intensities at corresponding positions are detected by the light intensity sensor. When the light intensity corresponding to the first alignment grating, the light intensity corresponding to the second alignment grating, the light intensity corresponding to the third alignment grating, and the light intensity corresponding to the fourth alignment grating reach a maximum at the same time, it is considered that the silicon wafer and the holographic mask have been aligned. Based on the light intensities corresponding to these four positions, the alignment position between the silicon wafer and the holographic mask during overlaying may be accurately obtained by a computer.

As an optional embodiment, in step S303, adjusting the relative position of the silicon wafer and/or holographic mask to determine the alignment position between the silicon wafer and the holographic mask with respect to the holographic lithography according to the preset alignment condition includes:

step S3031, a relative position of the silicon wafer and/or the holographic mask in a first direction is adjusted to determine a first position where the light intensity corresponding to the first alignment grating and the light intensity corresponding to the third alignment grating are equal and both reach the maximum value, wherein the first direction is perpendicular to the length direction of the first period fringe; and step S3032, a relative position of the silicon wafer and/or the holographic mask in a second direction is adjusted to determine a second position where the light intensity corresponding to the second alignment grating and the light intensity corresponding to the fourth alignment grating are equal and both reach the maximum value, wherein the second direction is perpendicular to the length direction of the second period fringe.

Specifically, due to a periodic distribution of the first period fringe and the third period fringe, the light intensity corresponding to the first alignment grating and the light intensity corresponding to the third alignment grating change periodically with the change of the relative position of the silicon wafer and the holographic mask in the first direction, and therefore, a preset alignment condition in the first direction is that the light intensity corresponding to the first alignment grating and the light intensity corresponding to the third alignment grating are equal and both reach the maximum value. The preset alignment condition is met every time the relative position is moved by a common multiple of two periods, but except for a smallest common multiple, offset corresponding to other common multiples is a larger value, which may be detected by conventional means. In addition, in the actual holographic lithography system, the silicon wafer or the holographic mask is moved in a limited range, and there will not be a case where the alignment position is different by one common multiple, so that the smallest common multiple of the two periods is the offset corresponding to the alignment.

Figure 4:
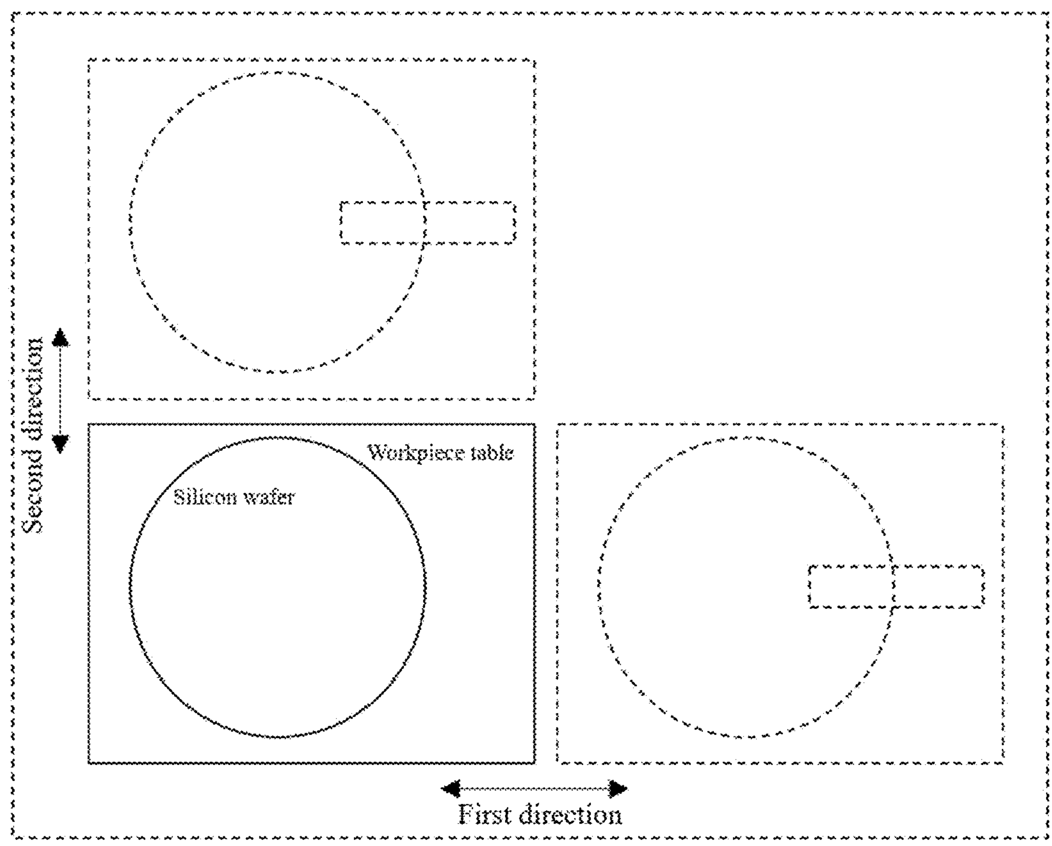
FIG. 4 is a schematic diagram of a movement of a silicon wafer of an embodiment of the present disclosure.

As shown in FIG. 4, when the relative position of the silicon wafer and/or the holographic mask in the first direction is adjusted, the silicon wafer or the holographic mask may be fixed first, and then the other is moved. For example, the holographic mask is fixed, then the silicon wafer is moved, and the silicon wafer is slowly moved in the first direction (at this time, the grating is moved along with the silicon wafer). When the light intensity corresponding to the first alignment grating and the light intensity corresponding to the third alignment grating are equal and both reach the maximum value, the position of the silicon wafer in the first direction, i.e., the first position, is recorded. The grating and the silicon wafer are relatively fixed, i.e., when one of the two is moved, the other follows, or the two remain stationary at the same time.

Therefore, the preset alignment condition may be met only by moving the silicon wafer or the holographic mask, which greatly simplifies an alignment adjustment process and strongly ensures the realization of ultra-high-accuracy overlaying.

If the alignment position cannot be found by moving only the silicon wafer or the holographic mask, the silicon wafer and the holographic mask may be moved at the same time, so that they are moved at different speeds opposite to each other or back to each other in the first direction. When the light intensity corresponding to the first alignment grating and the light intensity corresponding to the third alignment grating are equal and both reach the maximum value, the position of the silicon wafer in the first direction relative to the holographic mask at this time, i.e., the first position, is recorded, (it may also be the position of the holographic mask relative to the silicon wafer in the first direction, or the positions of the holographic mask and the grating in the first direction are recorded at the same time). Instead, when the silicon wafer and the holographic mask are moved at different speeds opposite to each other or back to each other in the second direction, and the preset alignment condition is met, the position of the silicon wafer relative to the holographic mask in the second direction at this time, i.e., the second position, is recorded (it may also be the position of the holographic mask relative to the silicon wafer in the second direction, or the positions of the holographic mask and the grating in the first direction are recorded at the same time).

As may be seen, for a case where the silicon wafer or the holographic mask is moved and the preset alignment condition cannot be met, the overlay alignment may also be implemented by simultaneously moving the silicon wafer or the holographic mask horizontally at different speeds, which is better in applicability and can meet the needs of an actual case without the need to worry about not being able to find the alignment position in the absence of other alignment system designs.

Considering that the holographic mask and the grating are placed in the same space coordinate system, z-direction positions of the two are different, z-coordinates are unchanged during a moving process, and the first position actually records coordinates, e.g., (x0, 0), of the silicon wafer in the first direction, i.e., an x-direction, during the alignment.

The same method is adopted to obtain the second position, i.e., coordinates (0, y0) of the silicon wafer in the second direction, i.e., a y-direction, during the alignment, and a relative spatial position (x0, y0) of the silicon wafer and the holographic mask on a horizontal plane may be determined according to the coordinates in the x-direction (the first position) and the coordinates in the y-direction (the second position).

Further, in step S3031, determining the first position where the light intensity corresponding to the first alignment grating and the light intensity corresponding to the third alignment grating are equal and both reach the maximum value includes:

step S30311, a first light intensity-displacement change curve and a second light intensity-displacement change curve are generated according to the light intensity corresponding to the first alignment grating and the light intensity corresponding to the third alignment grating respectively; and step S30312, coordinates of a first intersection of the first light intensity-displacement change curve and the second light intensity-displacement change curve at the highest point are obtained, wherein the coordinates of the first intersection closest to the origin are coordinates of the first position.

Specifically, taking moving the silicon wafer as an example, an abscissa of the first light intensity-displacement change curve and the second light intensity-displacement change curve is a displacement amount, and an ordinate is a light intensity. The light intensity corresponding to the first alignment grating and the light intensity corresponding to the third alignment grating are recorded when the silicon wafer is moved back and forth in the first direction, thus generating the first light intensity-displacement change curve and the second light intensity-displacement change curve. Through the first light intensity-displacement change curve and the second light intensity-displacement change curve, the coordinates of the first position in the first direction that meets the preset alignment condition may be quickly found, i.e., the coordinates of the first intersection of the first light intensity-displacement change curve and the second light intensity-displacement change curve at the highest point, so as to determine the displacement amount of the silicon wafer in the first direction, and the alignment in the first direction may be implemented by moving the silicon wafer in the first direction according to the displacement amount.

The embodiment of the present disclosure may quickly and visually obtain the position of the silicon wafer of the holographic mask during the alignment in the first direction by generating the first light intensity-displacement change curve and the second light intensity-displacement change curve.

Further, in step S3032, determining the second position where the light intensity corresponding to the second alignment grating and the light intensity corresponding to the fourth alignment grating are equal and both reach the maximum value includes:

step S30321, a third light intensity-displacement change curve and a fourth light intensity-displacement change curve are generated according to the light intensity corresponding to the second alignment grating and the light intensity corresponding to the fourth alignment grating respectively; and step S30322, coordinates of a second intersection of the third light intensity-displacement change curve and the fourth light intensity-displacement change curve at the highest point are obtained, wherein the coordinates of the second intersection closest to the origin are coordinates of the second position.

Specifically, still taking moving the silicon wafer as an example, an abscissa of the third light intensity-displacement change curve and the fourth light intensity-displacement change curve is a displacement amount, and an ordinate is a light intensity. The light intensity corresponding to the second alignment grating and the light intensity corresponding to the fourth alignment grating are recorded when the silicon wafer is moved back and forth in the second direction, thus generating the third light intensity-displacement change curve and the fourth light intensity-displacement change curve. Through the third light intensity-displacement change curve and the fourth light intensity-displacement change curve, the coordinates of the second position in the second direction that meets the preset alignment condition may be quickly found, i.e., the coordinates of the second intersection of the third light intensity-displacement change curve and the fourth light intensity-displacement change curve at the highest point, so as to determine the displacement amount of the silicon wafer in the second direction, and the alignment in the second direction may be implemented by moving the silicon wafer in the second direction according to the displacement amount.

The embodiment of the present disclosure may quickly and visually obtain the position of the silicon wafer of the holographic mask during the alignment in the first direction by generating the third light intensity-displacement change curve and the fourth light intensity-displacement change curve.

It should be understood that after obtaining the coordinates of the first position and the coordinates of the second position, the silicon wafer may be moved in the first direction according to the coordinates of the first position, and then the silicon wafer is moved in the second direction according to the coordinates of the second position, so as to implement the alignment between the silicon wafer and the holographic mask on the horizontal plane. It is also possible to control, based on the coordinates of the first position and the coordinates of the second position at the same time, the silicon wafer to be moved linearly along a hypotenuse between the first direction and the second direction to a position that meets the coordinates of the first position and the coordinates of the second position at the same time.

Figure 5:
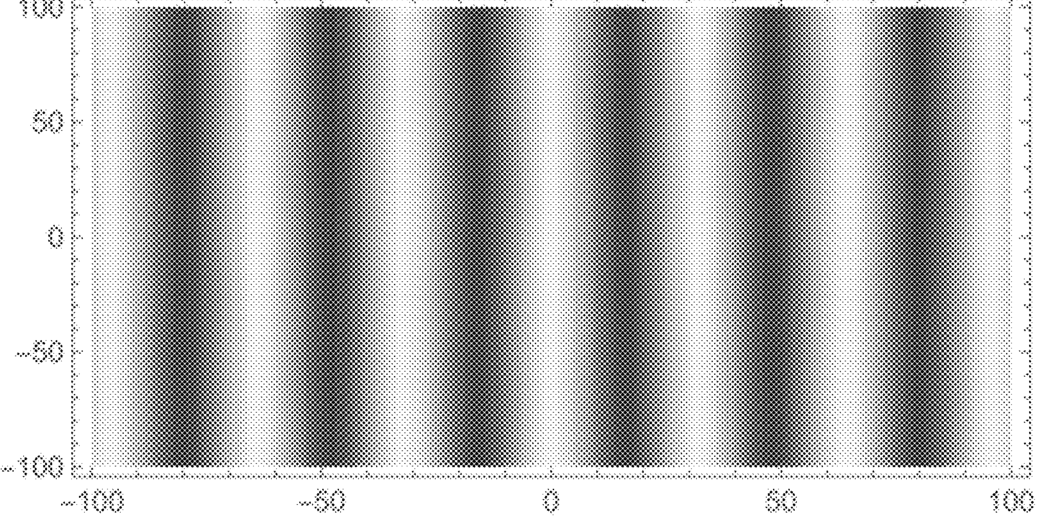
FIG. 5 is a schematic diagram of an interference fringe of an embodiment of the present disclosure.

As an optional embodiment, the first period fringe, the second period fringe, the third period fringe and the fourth period fringe are all interference fringes, and as shown in FIG. 5, a light intensity distribution of the interference fringes is:

$$I_0\left(1+\sin\left(2\pi\frac{x}{T}\right)\right)$$

where T is a period, $I_0$ is a reference light intensity, and x is an abscissa of a target point in the interference fringes.

In this embodiment, assuming an initial position, bright fringes in the first period fringe, the second period fringe, the third period fringe, and the fourth period fringe just all pass through the corresponding gratings, a grating period is T, the number of the gratings is n, and a light intensity value received by the light intensity sensor after the occurrence of displacement x' of the silicon wafer or the holographic mask is:

$$I_0\left(1+\sin\left(2\pi\frac{x}{T}\right)\right)n\int_{0+x'}^{\frac{T}{2}+x'} I_0\left(1+\sin\left(2\pi\frac{x}{T}\right)\right)=n\frac{T}{\pi}I_0\cos\left(2\pi\frac{x'}{T}\right)+n\frac{T}{2}I_0.$$

Figure 6:
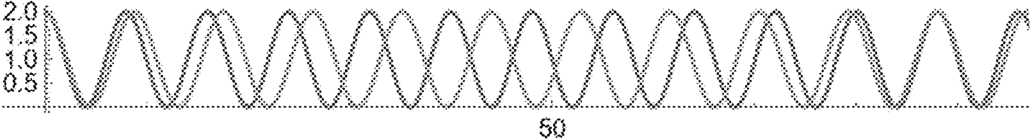
FIG. 6 is a schematic diagram of light intensity-displacement in one case in an embodiment of the present disclosure.

When the workpiece table performs a scanning movement in one direction, due to the existence of two fringe-grating pairs with periods having a small gap in the direction, the computer can draw four light intensity-displacement change curves according to data collected in a movement process, i.e., the first light intensity-displacement change curve, the second light intensity-displacement change curve, the third light intensity-displacement change curve, and the fourth light intensity-displacement change curve. The first light intensity-displacement change curve and the second light intensity-displacement change curve or the third light intensity-displacement change curve and the fourth light intensity-displacement change curve are shown in FIG. 6, and the intersection at apexes of the two corresponding curves is the alignment position in the first direction or the second direction. At this time, the four light intensity-displacement change curves are all trigonometric curves. Although it is possible to obtain an alignment point through the image, a derivative of the alignment point is small, and an alignment difficulty is large, so it is necessary to cooperate with the high-accuracy light intensity sensor to implement the highly accurate alignment.

Considering specificity of the holographic mask, i.e., a design of the mask by a calculation of a diffraction model, an arbitrary light intensity distribution may be freely obtained at any position behind the mask, and the alignment image is taken to be an arbitrary periodic fringe with a distribution of:

$$f(x)$$

with a period T. When displacement x' occurs, the light intensity distribution obtained by the light intensity sensor is:

$$n\int_{0+x'}^{\frac{T}{2}+x'} f(x) = F\left(\frac{T}{2}+x'\right) - F(x').$$

In the previous embodiment, since all the four light intensity-displacement change curves are trigonometric curves, the derivative of the alignment point is small, which makes it difficult to confirm whether or not the alignment is accurate near the alignment position.

Therefore, in some other embodiments, the first period fringe, the second period fringe, the third period fringe and the fourth period fringe are all period fringes with a light-dark fringe ratio of 1:1, and a light intensity of the bright fringes and the dark fringes does not change.

Figure 7:
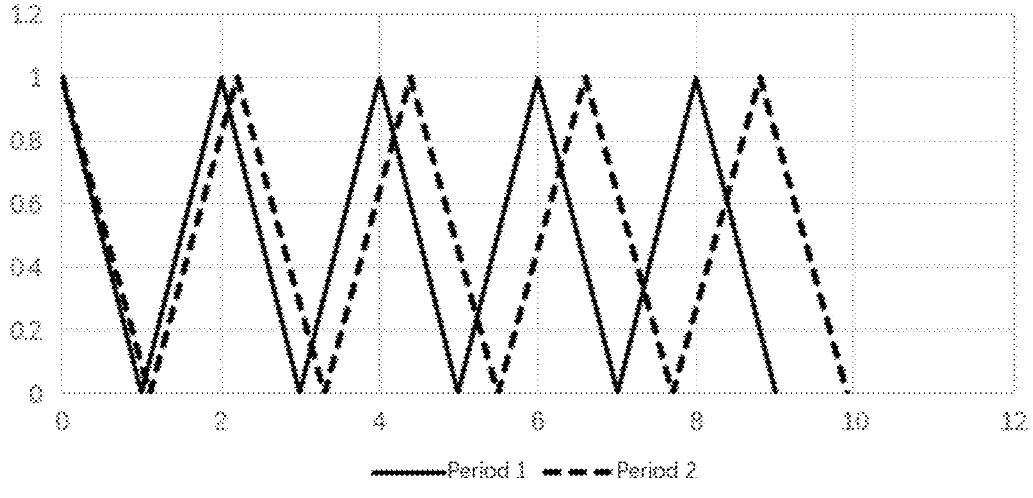
FIG. 7 is a schematic diagram of light intensity-displacement in another case in an embodiment of the present disclosure.

At this time, a brightness of half of the period of the first period fringe, the second period fringe, the third period fringe, and the fourth period fringe is 10, a brightness of half of the period is 0, as shown in FIG. 7, the four light intensity-displacement change curves obtained are line charts, which are sharper at the highest point compared with a trigonometric function, which may have better differentiation, and an intersection position can also be accurately obtained without the need of a very high-accuracy light intensity sensor, thus improving the alignment accuracy.

In some other optional embodiments, the first period fringe and the second period fringe are both period fringes with a light-dark fringe ratio of 1:1, a light intensity in the middle of a bright fringe is weaker than that at two ends, and a light intensity of a dark fringe does not change. The third period fringe and the fourth period fringe are both period fringes with a light-dark fringe ratio of 1:1, a light intensity in the middle of a bright fringe is stronger than that at two ends, and a light intensity of a dark fringe does not change.

In order to improve the alignment accuracy, what is required is that the four light intensity-displacement change curves have high accuracy when aligned at the same phase, and that two curves may have a more significant difference in intensity when there is a slight deviation in position. Therefore, specific shapes of two curves, and even whether they are in the same shape, may be taken into account.

The embodiment of the present disclosure designs fringes of two different periods with different intensity distributions. The first period fringe, the second period fringe, the third period fringe, and the fourth period fringe all have completely dark fringes of one half of a period, wherein bright fringes of the first period fringe and the second period fringe are bright in middles and dark on edges, bright fringes of the third period fringe and the fourth period fringe are dark in middles and bright on edges, and they all have large derivatives at bright-dark dividing lines.

Figure 8:
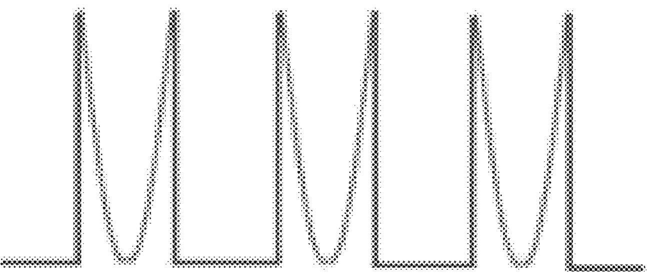
FIG. 8 is a schematic diagram of a light intensity distribution of a bright fringe in an embodiment of the present disclosure.

Specifically, as shown in FIG. 8, light intensity distributions of the bright fringes in the first period fringe and the third period fringe are:

$$I_1\sin\left(2\pi\frac{x}{T_1}\right).$$

Figure 9:
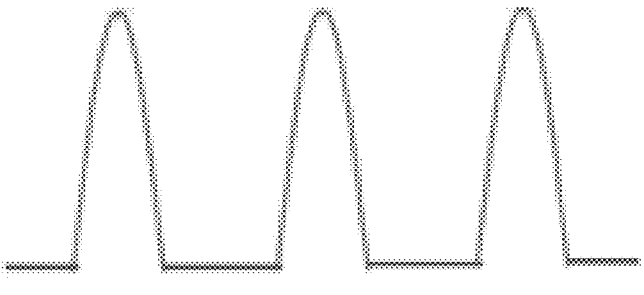
FIG. 9 is a schematic diagram of a light intensity distribution of another bright fringe in an embodiment of the present disclosure.

As shown in FIG. 9, light intensity distributions of the bright fringes in the second period fringe and the fourth period fringe are:

$$I_2\left(1-\sin\left(2\pi\frac{x}{T_2}\right)\right)$$

where $I_1$ and $I_2$ are corresponding reference light intensities, and $T_1$ and $T_2$ are corresponding periods.

Figure 10:
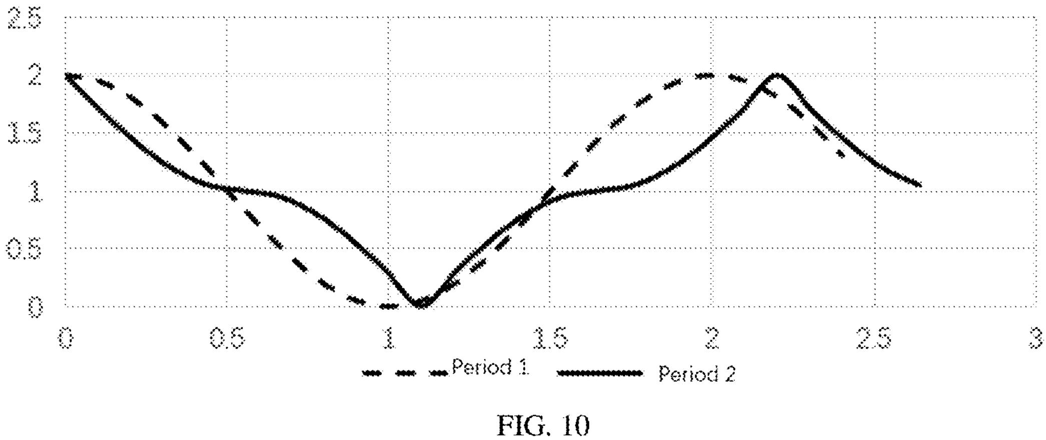
FIG. 10 is a schematic diagram of light intensity-displacement in yet another case in an embodiment of the present disclosure.

For the convenience of discussion and detection, the first light intensity-displacement change curve and the second light intensity-displacement change curve are taken as an example. The two are aligned at the origin position, and maximum light intensities detected from the first light intensity-displacement change curve and the second light intensity-displacement change curve are the same. The period $T_2$ of the second period fringe is larger than the period $T_1$ of the first period fringe. In such a case, the two sets of curves obtained are as shown in FIG. 10. In such a situation, when phases of the two curves cannot be aligned, the appearing deviation is more significant, so that the intersection position can be accurately obtained, and the overlay alignment accuracy can be further improved.

The alignment method based on holographic lithography of the present disclosure does not require additional light paths, apparatuses, and optical processes, and thus may reduce energy consumption, reduce cost, reduce errors, simplify the system, reduce the difficulty of mounting and deployment, and reduce the difficulty of processing. The integrity, stability, and accuracy of the holographic lithography system are improved, and the ultra-high overlay accuracy of a lithographic exposure technique is ensured. Besides, since the spatial light intensity distribution may be self-designed and arbitrarily implemented, this set of alignment method has great flexibility and plasticity. Most of traditional projection lithography alignment methods may theoretically be reproduced without the need to mount expensive and extremely difficult-to-machine optical apparatuses used by those methods, but the same final spatial light intensity distribution may be obtained, and the same alignment theoretical model and algorithm are used. In addition, the method of the embodiment of the present disclosure may further obtain a result of the spatial light intensity distribution which is difficult, or even impossible, to obtain by the traditional optical process, based on which a completely new alignment algorithm may be designed to further improve the overlay alignment precision, which has a very high potential for application.

Figure 11:
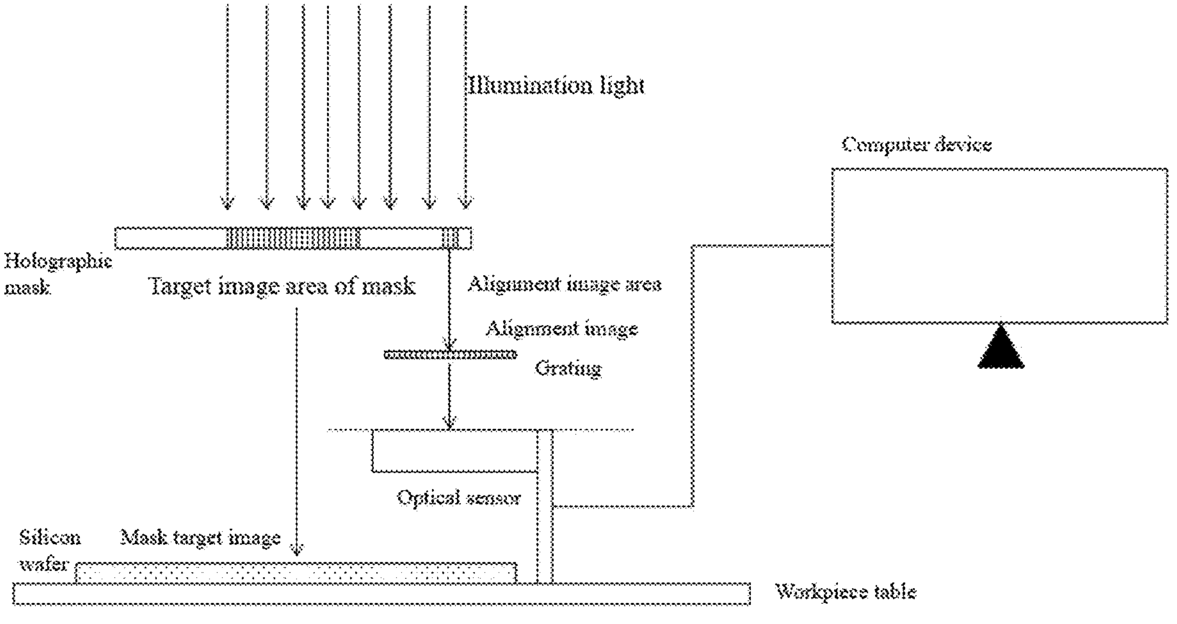
FIG. 11 is a schematic structural diagram of an alignment system based on holographic lithography of an embodiment of the present disclosure.

An embodiment of the present disclosure further provides a holographic lithography system, as shown in FIG. 11, including a holographic mask, a grating, a light intensity sensor and a silicon wafer sequentially arranged along a transmission direction of an illumination light, the grating is fixed on a workpiece table on which the silicon wafer is placed, the light intensity sensor is connected to a computer device, and the holographic lithography system is configured to implement the alignment method based on holographic lithography according to the above embodiments of the present disclosure.

Specifically, when the illumination light is incident on the holographic mask, an alignment image area is illuminated at the same time when a target image area of the mask is illuminated, so that it generates an alignment image on a surface of a grating in front of the light intensity sensor. The alignment image reaches the light intensity sensor after being partially obscured by the grating, and the light intensity sensor records a detected light intensity.

The workpiece table will perform a scanning movement in a first direction and a second direction, and light intensity data recorded by the light intensity sensor in this process is transmitted back to the computer device. The computer device draws an image of a function of the light intensity recorded by the light intensity sensor and a position of the workpiece table, and analyzes and processes the image of the function according to the alignment method based on holographic lithography in the above embodiment of the present disclosure, so that an alignment position may be found.

Figure 12:
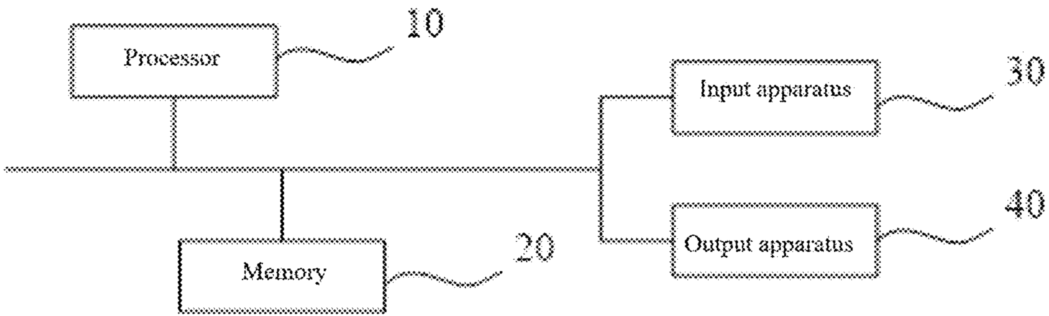
FIG. 12 is a schematic structural diagram of a computer device of an embodiment of the present disclosure.

An embodiment of the present disclosure further provides a schematic structural diagram of a computer device, as shown in FIG. 12, which includes: one or more processors 10, a memory 20, and interfaces for connecting various components, including a high-speed interface and a low-speed interface. The various components are in a communication connection with each other using different buses and may be mounted on a common motherboard or mounted in other ways as required. The processor may process instructions executed within the computing device, including instructions stored in or on the memory to display graphical information of a GUI on an external input/output apparatus (e.g., a display device coupled to the interface). In some optional embodiments, a plurality of processors and/or a plurality of buses may be used together with a plurality of memories if desired. Similarly, a plurality of computer devices may be connected, with the individual devices providing part of a necessary operation (e.g., as a server array, a group of blade servers, or a multiprocessor system). A processor 10 is shown as an example in FIG. 12.

The processor 10 may be a central processor, a network processor or a combination thereof. The processor 10 may further include a hardware chip. The above hardware chip may be a specialized integrated circuit, a programmable logic device or a combination thereof. The above programmable logic device may be a complex programmable logic device, a field programmable logic gate array, a general purpose array logic, or any combination thereof.

The memory 20 stores instructions executable by the at least one processor 10 to cause the at least one processor 10 to execute and implement the method illustrated in the above embodiment.

The memory 20 may include a storage program area and a storage data area, wherein the storage program area may store an operating system and an application program required by at least one function, and the storage data area may store data created according to the use of the computer device, etc. In addition, the memory 20 may include a high-speed random access memory, and may further include a non-transient memory, such as at least one disk memory device, a flash memory device, or other non-transient solid state memory device. In some optional embodiments, the memory 20 includes memories remotely arranged relative to the processor 10, and these remote memories may be connected to this computer device via a network. Examples of the above network include, but are not limited to, the Internet, corporate intranets, local area networks, mobile communication networks, and combinations thereof.

The memory 20 may include a volatile memory, e.g., a random access memory. The memory may also include a non-volatile memory, e.g., a flash memory, a hard disk, or a solid state disk. The memory 20 may also include a combination of the above types of memories.

The computer device further includes an input apparatus 30 and an output apparatus 40. The processor 10, the memory 20, the input apparatus 30 and the output apparatus 40 may be connected via a bus or other means, and the connection via the bus is taken as an example in FIG. 12.

The input apparatus 30 may receive input numeric or character information, as well as generate inputs of key signals related to user settings as well as function control of this computer device, such as a touch screen, a keypad, a mouse, a trackpad, a touchpad, an indicator bar, one or more mouse buttons, a trackball, a joystick, etc. The output apparatus 40 may include a display device, an auxiliary lighting apparatus (e.g., an LED), a haptic feedback apparatus (e.g., a vibration motor), etc. The above display device includes, but is not limited to, a liquid crystal display, a light emitting diode, a display, and a plasma display. In some optional embodiments, the display device may be a touch screen.

Although the embodiments of the present disclosure are described in conjunction with the accompanying drawings, various modifications and variations may be made by those of skill in the art without departing from the spirit and scope of the present disclosure, and such modifications and variations fall within the scope defined by the appended claims.

The invention claimed is:

1. An alignment method based on holographic lithography, applied to a holographic lithography system, wherein the holographic lithography system comprises a holographic mask and a silicon wafer sequentially arranged along the transmission direction of an illumination light, and the method comprises:

controlling the illumination light to generate an alignment image after passing through an alignment image area of the holographic mask, wherein the alignment image comprises a first period image and a second period image, and the period of the first period image is different from that of the second period image;

obtaining a light intensity corresponding to the first period image and a light intensity corresponding to the second period image generated according to the alignment image; and adjusting a relative position of the silicon wafer and/or the holographic mask to determine an alignment position between the silicon wafer and the holographic mask with respect to the holographic lithography according to a preset alignment condition, wherein the preset alignment condition is that the light intensity corresponding to the first period image and the light intensity corresponding to the second period image are equal and both reach a maximum value;

wherein the holographic lithography system further comprises a grating and a light intensity sensor sequentially arranged between the holographic mask and the silicon wafer along the transmission direction of the illumination light, the grating and the silicon wafer are relatively fixed, the grating is correspondingly provided with a first alignment area corresponding to the first period image and a second alignment area corresponding to the second period image, the first period image comprises a first period fringe and a second period fringe with the same period, the second period image comprises a third period fringe and a fourth period fringe with the same period, a length direction of the first period fringe and a length direction of the third period fringe are the same and perpendicular to a length direction of the second period fringe and a length direction of the fourth period fringe, the first alignment area comprises a first alignment grating and a second alignment grating with the same shapes as the first period fringe and the second period fringe respectively, and the second alignment area comprises a third alignment grating and a fourth alignment grating with the same shapes as the third period fringe and the fourth period fringe respectively;

wherein obtaining the light intensity corresponding to the first period image and the light intensity corresponding to the second period image generated according to the alignment image comprises:

obtaining a light intensity corresponding to the first alignment grating, a light intensity corresponding to the second alignment grating, a light intensity corresponding to the third alignment grating, and a light intensity corresponding to the fourth alignment grating when the illumination light sequentially passes through the alignment image area and the grating;

wherein adjusting the relative position of the silicon wafer and/or the holographic mask to determine the alignment position between the silicon wafer and the holographic mask with respect to the holographic lithography according to the preset alignment condition comprises:

adjusting a relative position of the silicon wafer and/or the holographic mask in a first direction to determine a first position where the light intensity corresponding to the first alignment grating and the light intensity corresponding to the third alignment grating are equal and both reach a maximum value, wherein the first direction is perpendicular to the length direction of the first period fringe; and adjusting a relative position of the silicon wafer and/or the holographic mask in a second direction to determine a second position where the light intensity corresponding to the second alignment grating and the light intensity corresponding to the fourth alignment grating are equal and both reach a maximum value, wherein the second direction is perpendicular to the length direction of the second period fringe.

2. The method according to claim 1, wherein the first period fringe, the second period fringe, the third period fringe and the fourth period fringe are all interference fringes, and a light intensity distribution of the interference fringes is:

$$I_0\left(1+\sin\left(2\pi\frac{x}{T}\right)\right)$$

where T is a period, $I_0$ is a reference light intensity, and x is an abscissa of a target point in the interference fringes.

3. The method according to claim 1, wherein:

the first period fringe, the second period fringe, the third period fringe and the fourth period fringe are all period fringes with a light-dark fringe ratio of 1:1, and the light intensity of the bright fringes and dark fringes does not change.

4. The method according to claim 1, wherein:

the first period fringe and the second period fringe are both period fringes with a light-dark fringe ratio of 1:1, the light intensity in the middle of a bright fringe is weaker than that at two ends, the light intensity of the dark fringe does not change, the third period fringe and the fourth period fringe are both period fringes with a light-dark fringe ratio is 1:1, the light intensity in the middle of a bright fringe is stronger than that at two ends, and the light intensity of the dark fringe does not change.

5. The method according to claim 1, wherein determining the first position where the light intensity corresponding to the first alignment grating and the light intensity corresponding to the third alignment grating are equal and both reach the maximum value comprises:

generating a first light intensity-displacement change curve and a second light intensity-displacement change curve according to the light intensity corresponding to the first alignment grating and the light intensity corresponding to the third alignment grating respectively; and obtaining coordinates of a first intersection of the first light intensity-displacement change curve and the second light intensity-displacement change curve at the highest point, wherein the coordinates of the first intersection closest to the origin are coordinates of the first position.

6. The method according to claim 5, wherein determining the second position where the light intensity corresponding to the second alignment grating and the light intensity corresponding to the fourth alignment grating are equal and both reach the maximum value comprises:

generating a third light intensity-displacement change curve and a fourth light intensity-displacement change curve according to the light intensity corresponding to the second alignment grating and the light intensity corresponding to the fourth alignment grating respectively; and obtaining coordinates of a second intersection of the third light intensity-displacement change curve and the fourth light intensity-displacement change curve at the highest point, wherein the coordinates of the second intersection closest to the origin are coordinates of the second position.

7. A holographic lithography system, comprising:

a holographic mask, a grating, a light intensity sensor, and a silicon wafer sequentially arranged along the transmission direction of an illumination light, wherein:

the grating is fixed on a workpiece table on which the silicon wafer is placed, the light intensity sensor is connected to a computer device, and the holographic lithography system is configured to implement the alignment method based on holographic lithography according to claim 1.

8. A computer device, comprising a memory and a processor in a communication connection to each other, wherein:

computer instructions are stored in the memory, and the processor executes the alignment method based on holographic lithography according to claim 1 by executing the computer instructions.

* * * * *